United States Patent
Zabel et al.

(10) Patent No.: US 9,863,990 B2
(45) Date of Patent: Jan. 9, 2018

(54) DETERMINING FAILURE OF AN ULTRAVIOLET SENSOR

(71) Applicant: Honeywell International Inc., Morristown, NJ (US)

(72) Inventors: Brian Zabel, Yorktown, IN (US); Chad Carty, Nobelsville, IN (US)

(73) Assignee: Honeywell International Inc., Morris Plains, NJ (US)

( * ) Notice: Subject to any disclaimer, the term of this patent is extended or adjusted under 35 U.S.C. 154(b) by 267 days.

(21) Appl. No.: 14/711,347

(22) Filed: May 13, 2015

(65) Prior Publication Data

US 2016/0334453 A1    Nov. 17, 2016

(51) Int. Cl.
*G01R 31/02* (2006.01)
*G01J 1/42* (2006.01)

(52) U.S. Cl.
CPC .............. *G01R 31/02* (2013.01); *G01J 1/429* (2013.01)

(58) Field of Classification Search
None
See application file for complete search history.

(56) References Cited

U.S. PATENT DOCUMENTS 4,823,114 A * 4/1989 Gotisar .................. F23N 5/082
                                                          340/578
6,515,283 B1   2/2003 Castleman et al.
7,244,946 B2   7/2007 Burnette et al.
8,516,895 B2   8/2013 Verner et al.
2005/0247883 A1 * 11/2005 Burnette ................ G01J 1/429
                                                          250/372

FOREIGN PATENT DOCUMENTS

JP    2012255729 A  * 12/2012 ............ G01J 5/0014

OTHER PUBLICATIONS

Yuichi et al, JP 2012255729, "Fire Sensor" (English Machine Translation, Published Dec. 27, 2012).*
Kshitij Shinghal. Intelligent Multi Sensor System for Agricultural Fire Detection. MIT International Journal of Electronics and Communication Engineering. Jan. 2014, pp. 7-11, vol. 4, No. 1.

* cited by examiner

*Primary Examiner* — Melissa Koval
*Assistant Examiner* — Felicia Farrow
(74) *Attorney, Agent, or Firm* — Brooks, Cameron, & Huebsch, PLLC

(57) ABSTRACT

Methods, devices, and systems for determining failure of an ultraviolet (UV) sensor are described herein. One device includes a memory, and a processor configured to execute executable instructions stored in the memory to reduce an excitation voltage of a UV sensor until no conduction occurs in the UV sensor, increase, upon no conduction occurring in the UV sensor, the excitation voltage of the UV sensor until a conduction event occurs, compare the excitation voltage at which the conduction event occurs to a reference voltage, and determine whether the UV sensor has failed based on the comparison.

20 Claims, 4 Drawing Sheets

DETERMINING FAILURE OF AN ULTRAVIOLET SENSOR

TECHNICAL FIELD

The present disclosure relates to methods, devices, and systems for determining failure of ultraviolet (UV) sensors.

BACKGROUND

Ultraviolet (UV) sensors are designed to detect the presence of UV radiation. For example, UV sensors may be utilized to detect the presence of radiation in the spectral range of approximately 10 nm to 400 nm.

UV sensors may be useful in many different product applications. For example, UV sensors may be useful in detecting the presence of a flame in a burner. Detecting the presence of a flame inside a burner can help a user (e.g., technician and/or maintenance personnel) safely operate and/or service the burner. For instance, if no flame is present in the burner, the user may shut the burner down to prevent unburned fuel from accumulating inside of the burner.

UV sensors may be damaged or wear out over time. For example, the fill-gas composition within the UV sensor may change over time. Other examples can include damage to the spacing of electrodes inside the UV sensor, or surface defects on the electrodes. Damage to a UV sensor can lead to dangerous operating conditions for a product application containing a UV sensor. Therefore, it is important to know if a UV sensor has become damaged or failed.

DETAILED DESCRIPTION

Figure 1:
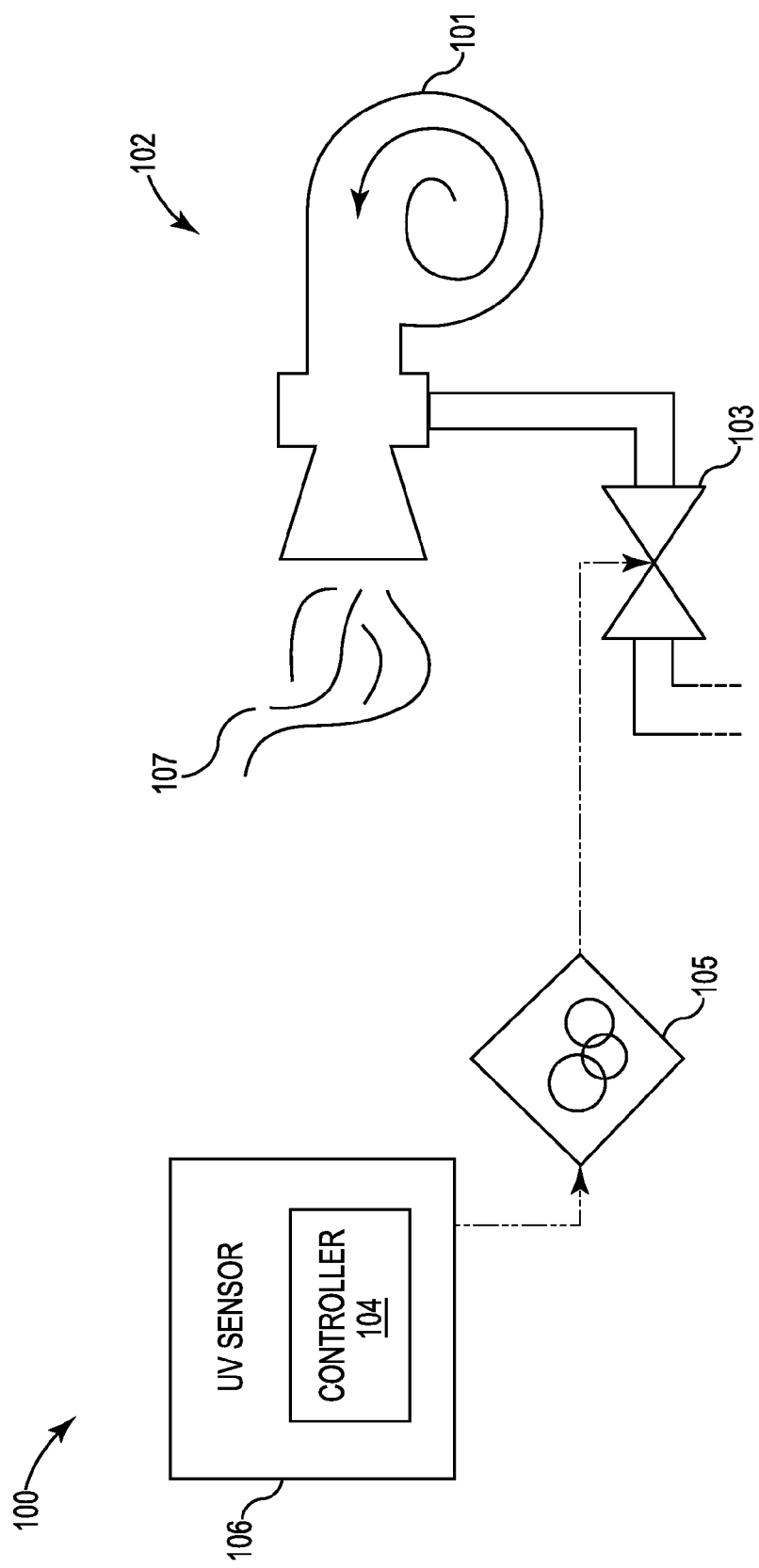
FIG. 1 illustrates a system for determining failure of an ultraviolet (UV) sensor, in accordance with one or more embodiments of the present disclosure.

Methods, devices, and systems for determining failure of an ultraviolet (UV) sensor are described herein. For example, one or more embodiments include a memory, and a processor configured to execute executable instructions stored in the memory to reduce an excitation voltage of a UV sensor until no conduction occurs in the UV sensor, increase, upon no conduction occurring in the UV sensor, the excitation voltage of the UV sensor until a conduction event occurs, compare the excitation voltage at which the conduction event occurs to a reference voltage, and determine whether the UV sensor has failed based on the comparison.

Determining the failure of a UV sensor, in accordance with the present disclosure, can allow a user (e.g., technician and/or maintenance personnel) to easily determine whether a UV sensor has become damaged and/or has failed. Such simple determination of whether a UV sensor has failed can lead to safer operation of product applications utilizing UV sensors. For example, a failed UV sensor may be indicated to a user before a dangerous condition arises in the operation of the product containing the failed UV sensor. The failed UV sensor can then be replaced without incident.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be reference as 404 in FIG. 4.

As used herein, "a" or "a number of" something can refer to one or more such things. For example, "a number of UV events" can refer to one or more UV events.

FIG. 1 illustrates a system 100 for determining failure of an ultraviolet (UV) sensor, in accordance with one or more embodiments of the present disclosure. As shown in FIG. 1, the system 100 includes a controller 104 and a UV sensor 106. Additionally, system 100 comprises a product application 102 that can include a burner 101, a shut-off valve 103, a burner management system 105, and a flame 107.

The UV sensor 106 can be a sensor designed to detect the presence of ultraviolet (UV) radiation emissions (e.g., UV events). UV radiation can include electromagnetic radiation with a wavelength that can range from 10 nanometers (nm) to 400 nm. For example, UV sensor 106 can be configured to detect the presence of UV radiation within a wavelength range of 10 nm to 400 nm.

Although UV sensor 106 is described as having a detection range from 10 nm to 400 nm, embodiments of the present disclosure are not so limited. For example, UV sensor 106 can have a detection range that is narrower than 10 nm to 400 nm (e.g., 180 nm to 260 nm).

The detection of UV emissions by UV sensor 106 can be referred to as a UV event. For example, UV sensor 106 detecting an instance of UV emission (e.g., electromagnetic radiation) within the wavelength range of 10 nm to 400 nm (e.g., 200 nm) can be a UV event. As another example, UV sensor 106 detecting a number of instances of UV emission can be a number of UV events.

UV sensor 106 can include a UV tube with electrodes located within. Further, UV sensor 106 can include a composition of fill-gas inside the UV tube, as will be further described herein (e.g., in connection with FIG. 3).

As shown in FIG. 1, product application 102 can include a burner 101, a shut-off valve 103, a burner management system 105, and a flame 107. For example, product application 102 can be a burner system that is utilizing UV sensor 106 to detect the presence of flame 107 from burner 101.

That is, UV sensor 106 can be used to detect the presence of flame 107 by detecting UV emissions (e.g., UV events) emitted from flame 107.

In some embodiments, burner 101 can be a fuel-air or fuel-oxygen burner to produce (e.g., generate) a flame 107. For example, burner 101 can be used to produce flame 107 to generate heat for use in residential and/or commercial hot water boiler/heater applications. However, embodiments of the present disclosure are not so limited. For example, burner 101 can be used for any other suitable application.

In some embodiments, shut-off valve 103 can be a fuel safety shut-off valve for burner 101. For example, if UV sensor 106 does not detect any UV events (e.g., does not detect the presence of flame 107), shut-off valve 103 can turn off the flow of fuel into burner 101, preventing the buildup of unburnt fuel in burner 101. As another example, if UV sensor 106 is determined to have failed, shut-off valve 103 can turn off the flow of fuel into burner 101.

In some embodiments, burner management system 105 can control various aspects of the operation of burner 101. For example, burner management system 105 can change the firing rate of burner 101 to produce a more intense flame 107 or a less intense flame 107 based on the required heat output of burner 101. As another example, burner management system 105 can turn burner 101 on and off.

In some embodiments, flame 107 can be a flame produced by burner 101 that emits UV radiation that can be sensed by UV sensor 106. For example, flame 107 can produce electromagnetic radiation in the wavelength defined by UV (e.g., 10 nm to 400 nm) that can be sensed by UV sensor 106.

The use of UV sensor 106 in product application 102 can render the operation of product application 102 safer. For example, if UV sensor 106 is utilized in a product application 102 such as a burner, UV sensor 106 can determine that a flame within the burner has been extinguished (e.g., quenched) due to UV events not being detected by UV sensor 106. A user (e.g., technician and/or maintenance personnel) can then shut down the burner in response to UV sensor 106 not detecting UV events to stop the flow of fuel into the burner when there is no flame to prevent the buildup of unburnt fuel and/or other associated problems (e.g., explosions).

Controller 104 can determine whether UV sensor 106 has failed. For example, controller 104 can reduce an excitation voltage of UV sensor 106 until no conduction occurs in UV sensor 106. Upon no conduction occurring in UV sensor 106, controller 104 can increase the excitation voltage of UV sensor 106 until a conduction event occurs. Controller 104 can then compare the excitation voltage at which the conduction event occurs to a reference voltage, and determine, based on the comparison, whether UV sensor 106 has failed. The process by which controller 104 can determine whether UV sensor 106 has failed will be further described herein (e.g., in connection with FIG. 2).

A conduction event can be defined by a first instance of conduction in UV sensor 106 as the excitation voltage of UV sensor 106 is increased from a non-conducting state when UV sensor 106 is in the presence of UV emissions. For example, as the excitation voltage of UV sensor 106 is increased, a conduction event occurs at the moment UV sensor 106 first begins to conduct (e.g., UV sensor 106 first begins to detect UV emissions).

A reference voltage, as used herein, is an excitation voltage at which UV sensor 106 is expected to detect a conduction event when UV sensor 106 is properly functioning. As the excitation voltage of UV sensor 106 is increased from a state where no UV events occur (e.g., no conduction in UV sensor 106), the conduction event can be expected to occur at a reference (e.g., a known) voltage. For example, as the excitation voltage is increased from 0 volts to 6 volts, the conduction event can be expected to occur at a reference voltage of 3 volts.

As another example, the excitation voltage of UV sensor 106 is decreased from a state where UV events are occurring (e.g., conduction in UV sensor 106) to a state where no UV events occur (e.g., no conduction in UV sensor 106). Conduction in UV sensor 106 can be expected to stop occurring when the excitation voltage of UV sensor 106 is reduced beyond a reference (e.g., a known) voltage.

Although the reference voltage is described as being a specific voltage, embodiments of the present disclosure are not so limited. For example, the reference voltage can be a known range of reference voltages. For instance, the reference voltage range can be between 2 and 4 volts. The reference voltage range can be an inclusive voltage range or an exclusive voltage range. Additionally, the reference voltage range can be a manufacturer's specification.

The conduction event can occur within the known range of reference voltages. For example, as an excitation voltage of UV sensor 106 is increased from 0 volts to 6 volts, the conduction event can be expected to happen between a reference voltage range of 2 volts to 4 volts (e.g., conduction event can happen at 3 volts).

Increasing the excitation voltage of UV sensor 106 from a state where no UV events occur (e.g., no conduction in UV sensor 106) until a conduction event occurs, and decreasing the excitation voltage of UV sensor 106 from a state where UV events are occurring (e.g., conduction in UV sensor 106) to a state where no UV events occur (e.g., no conduction in UV sensor 106) can bound the range of operation of UV sensor 106. This bounded range of operation of UV sensor 106 can be compared to acceptable limits of the range of operation of UV sensor 106.

In some embodiments, the reference voltage can be specified by a manufacturer of UV sensor 106. For example, controller 104 may include (e.g., store) a reference voltage specified by the manufacturer of UV sensor 106. The reference voltage can be specified by the manufacturer as a result of product testing that produces a reliable reference voltage at which UV sensor 106 can be expected to detect a conduction event.

In some embodiments, the reference voltage and/or reference voltage range of UV sensor 106 can vary based on the construction of UV sensor 106. For example, changes in the position of electrodes, the composition of the fill gas, and/or the pressure within the UV tube of UV sensor 106 can result in a reference voltage and/or reference voltage range that differs from a UV sensor with different electrode positioning, fill gas composition, and/or pressure within the UV tube.

Figure 2:
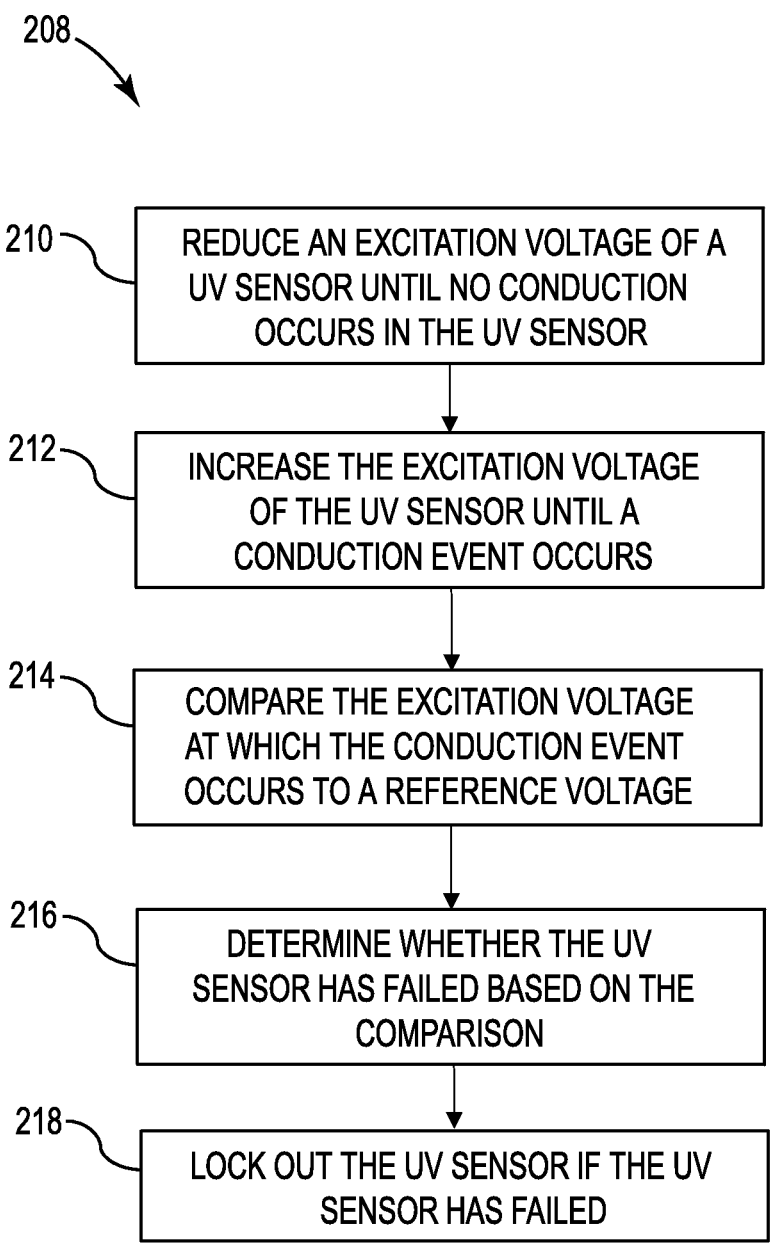
FIG. 2 is a flow chart of a method for determining failure of a UV sensor, in accordance with one or more embodiments of the present disclosure.

FIG. 2 is a flow chart of a method 208 for determining failure of a UV sensor (e.g., UV sensor 106 and 306 described in connection with FIGS. 1 and 3, respectively), in accordance with one or more embodiments of the present disclosure. Method 208 can be performed by, for example, controllers 104 and 404, as described in connection with FIGS. 1 and 4, respectively.

At block 210 of method 208, the controller can reduce an excitation voltage of a UV sensor until no conduction occurs in the UV sensor. As used herein, conduction occurring in the UV sensor indicates a sufficient excitation voltage being applied to the UV sensor such that the UV sensor is detecting UV events. For example, the controller can supply an excitation voltage to the UV sensor such that when the UV sensor is detecting UV events (e.g., UV emissions), conduction is occurring in the UV sensor.

As the controller reduces the excitation voltage of the UV sensor, conduction will cease to occur in the UV sensor. For example, the UV sensor will not detect UV events at an excitation voltage that has been reduced beyond the reference voltage. As another example, the UV sensor will not detect UV events at an excitation voltage that has been reduced beyond a reference voltage range.

At block 212 of method 208, the controller can increase the excitation voltage of the UV sensor until a conduction event occurs. For example, once no conduction occurs in the UV sensor, the controller can increase the excitation voltage of the UV sensor until the UV sensor detects a conduction event. The conduction event can correspond to a first instance of conduction occurring in the UV sensor (e.g., a first UV event) as the excitation voltage is increased.

The controller can determine the excitation voltage at which the conduction event occurs. For example, as the excitation voltage of the UV sensor is increased, the excitation voltage (e.g., 3 volts) at which the conduction event occurs can be recorded.

At block 214 of method 208, the controller can compare the excitation voltage at which the conduction event occurs to a reference voltage. For example, if the conduction event occurs at an excitation voltage of 3 volts, the controller can compare the excitation voltage (e.g., 3 volts) to a reference voltage of 4 volts.

In some embodiments, the reference voltage can be a range of reference voltages. For example, the reference voltage range can be a range of voltages at which a conduction event can be expected to happen. For instance, the reference voltage range can be a range of 2-4 volts. If the conduction event occurs at an excitation voltage of 3 volts, the controller can compare the excitation voltage of the conduction event (e.g., 3 volts) to the reference voltage range of 2-4 volts.

At block 216 of method 208, the controller can determine whether the UV sensor has failed based on the comparison of the excitation voltage of the conduction event to the reference voltage. For example, the controller can compare an excitation voltage of a conduction event (e.g., 3 volts) to a reference voltage (e.g., 4 volts) to determine whether the UV sensor has failed.

The UV sensor can be determined to have failed upon the excitation voltage at which the conduction event occurs and the reference voltage being different. For example, if the excitation voltage of the conduction event is 3 volts and the reference voltage is 4 volts, the controller can determine that the UV sensor has failed based on the excitation voltage of the conduction event being different than the reference voltage. As another example, if the excitation voltage of the conduction event is 5 volts and the reference voltage is 4 volts, the controller can determine that the UV sensor has failed based on the excitation voltage of the conduction event being different than the reference voltage.

In embodiments in which the reference voltage is a range of reference voltages, the UV sensor can be determined to have failed upon the excitation voltage at which a conduction event occurs being outside the reference voltage range. For example, if the excitation voltage of the conduction event is 5 volts and the range of reference voltages is 2-4 volts, the controller can determine that the UV sensor has failed based on the excitation voltage of the conduction event being outside of the range of reference voltages.

That is, the UV sensor can be determined to have failed based on the excitation voltage at which the conduction event occurs being higher or lower than the reference voltage or the reference voltage range. For example, the conduction event can occur at an excitation voltage that is higher or lower than a reference voltage to result in the UV sensor having failed. As another example, the conduction event can occur at an excitation voltage that is higher or lower than a reference voltage range to result in the UV sensor having failed.

In some embodiments, the controller can determine the UV sensor has not failed. For example, if the conduction event occurs at an excitation voltage of 4 volts, the controller can compare the excitation voltage of the conduction event (e.g., 4 volts) to a reference voltage of 4 volts and determine that the UV sensor has not failed based on the excitation voltage of the conduction event being the same as the reference voltage. As an additional example, if the conduction event occurs at an excitation voltage of 3 volts, the controller can compare the excitation voltage of the conduction event (e.g., 3 volts) to a reference voltage range of 2-4 volts and determine that the UV sensor has not failed based on the excitation voltage of the conduction event being within the range of reference voltages.

At block 218 of method 208, the controller can lock out the UV sensor if the UV sensor has been determined to have failed (e.g., software lockout condition). For example, once the controller has determined the UV sensor has failed, the controller can lock out the UV sensor via software so that a user (e.g., technician and/or maintenance personnel) may safely replace the UV sensor. As another example, the controller can lock out the product application the UV sensor is being used in so that a user may safely perform maintenance (e.g., replace the UV sensor) or perform other tasks associated with the product application.

A lock out condition (e.g., software lockout condition), as used herein, is a process by which a piece of equipment (e.g., UV sensor and/or product application) is secured against accidental energization during repairs and/or maintenance. A software lock out condition can be utilized to prevent a user from being harmed by equipment that may unexpectedly start while the user is performing tasks on the equipment.

Method 208 can be performed while the UV sensor is detecting UV events. For example, the UV sensor can be checked for failure while the UV sensor is operating within a product application (e.g., product application 102 described in connection with FIG. 1). Further, the UV sensor can be checked while the product application containing the UV sensor is operating. For instance, the UV sensor can be checked for failure without having to take a product application offline.

Method 208 can be performed upon the excitation voltage at which the conduction event occurs being the same as the reference voltage. For example, the method can be repeated as long as the excitation voltage of the conduction event is the same as the reference voltage. For instance, the method can be repeated for as long as the UV sensor has not been indicated to have failed.

In some embodiments, the results of the method can be subject to additional signal processing. For example, the excitation voltage at which the conduction event occurs can be logged, and an average excitation voltage over a sample size of measurements of conduction events can be compared to a reference voltage and/or reference voltage range. As another example, the results can be normalized and/or totaled for other data analyses.

In some embodiments, the method 208 can be repeated at a particular frequency. For example, the method can be repeated more than once per second (e.g., 3 times per second). However, embodiments of the present disclosure are not so limited. For example, the method can be repeated once per second or less than once per second.

In some embodiments, the frequency of the repeating of method 208 can be more than once per second if the product application containing the UV sensor is operating at a high capacity. For example, if the UV sensor is being utilized in a product application such as a burner, the method 208 can be repeated more often when the burner is being heavily utilized (e.g., more intense flame).

In some embodiments, the frequency of the repeating of method 208 can be less than or equal to once per second if the product application containing the UV sensor is not operating at a full capacity. For example, if the UV sensor is being utilized in a product application such as a burner, the method 208 can be repeated less often when the burner is not being heavily utilized (e.g., less intense flame).

In some embodiments, the frequency of the repeating of method 208 can be increased as the UV sensor ages. For example, as a UV sensor gets older and becomes worn with use from operation in a product application, the UV sensor can be more likely subject to a failure than a new UV sensor. Therefore, the method 208 to check for UV sensor failure can be repeated more often on an older UV sensor than on a newer UV sensor.

The method 208 can be concluded upon the UV sensor being determined to have failed. For example, upon the excitation voltage of a conduction event being different than a reference voltage or the excitation voltage being outside of a range of reference voltages, the method 208 can be concluded and the controller can render the UV sensor and/or product application in a lock out condition.

Figure 3:
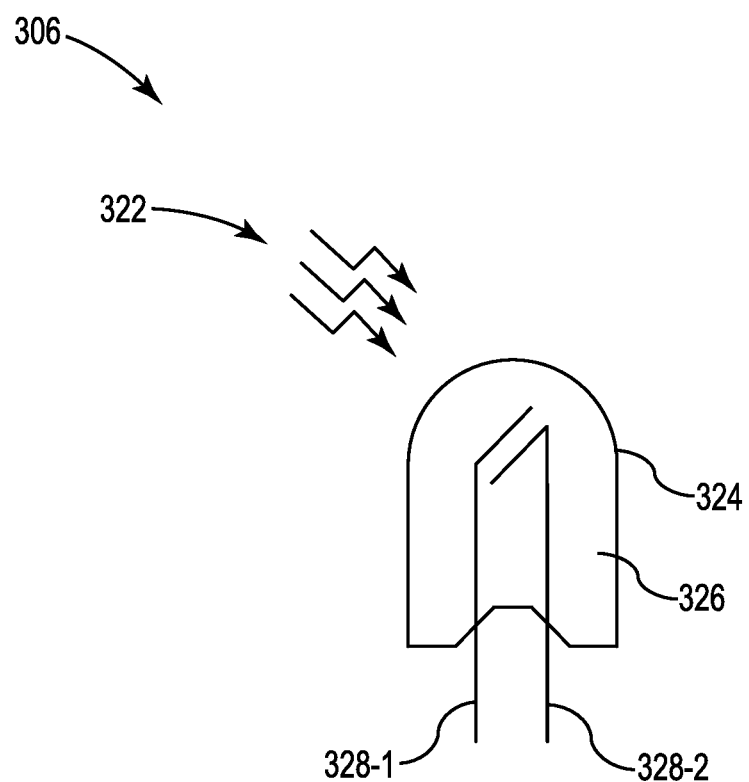
FIG. 3 is an illustration of a portion of a UV sensor, in accordance with one or more embodiments of the present disclosure.

FIG. 3 is an illustration of a portion of a UV sensor 306, in accordance with one or more embodiments of the present disclosure. UV sensor 306 can be, for example, UV sensor 106 previously described in connection with FIG. 1. As shown in FIG. 3, a UV sensor 306 can include a UV tube 324, electrodes 328-1 and 328-2, and a fill-gas composition 326.

UV tube 324, as used herein, can be a housing that includes a fill-gas composition 326 and electrodes 328-1 and 328-2. Additionally, UV tube 324 can be a housing formed from material to allow the penetration of UV emissions 322 into UV tube 324.

UV tube 324 can include fill-gas composition 326. Fill-gas composition 326 can be a composition of one or more gases to allow for the detection of UV events by UV sensor 306. Additionally, fill-gas composition 326 can be a volume to induce a certain pressure within UV tube 324 to allow for detection of UV events by UV sensor 306.

UV tube 324 can include electrodes 328-1 and 328-2. For example, electrodes 328-1 and 328-2 can be placed within UV tube 324 at a specified distance so as to allow for detection of UV events by UV sensor 306.

Signs of a UV sensor that is aging can include reduced pressure of fill-gas composition 326 or a change in the spacing of electrodes 324. For example, a change in the spacing of electrodes 324 can lead to a change in the excitation voltage at a conduction event, which can lead to UV sensor failure.

Figure 4:
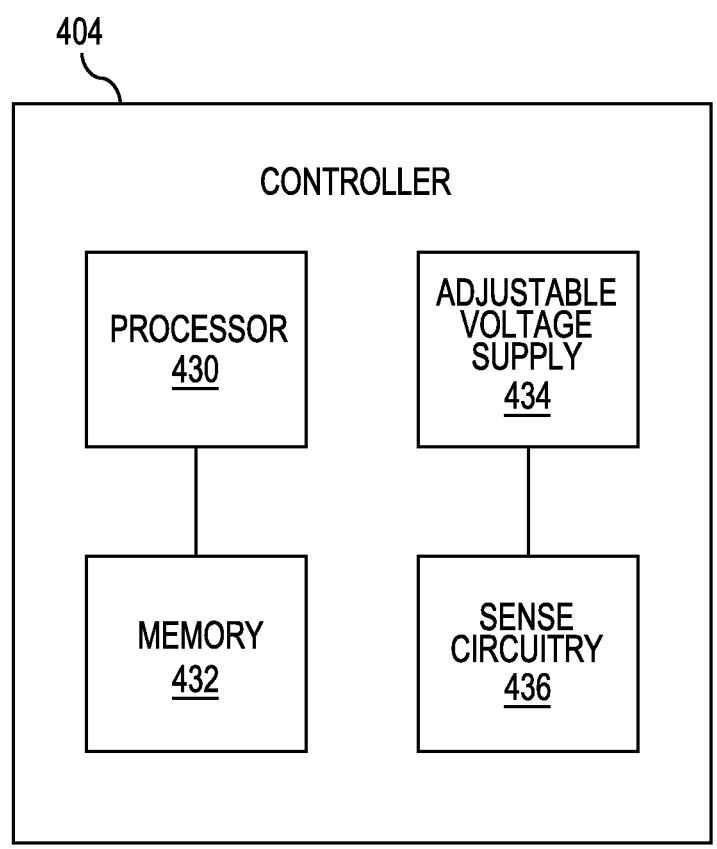
FIG. 4 is a schematic block diagram of a controller for determining failure of a UV sensor, in accordance with one or more embodiments of the present disclosure.

FIG. 4 is a schematic block diagram of a controller 404 for determining failure of a UV sensor, in accordance with one or more embodiments of the present disclosure. Controller 404 can be, for example, controller 104 previously described in connection with FIG. 1. For example, controller 404 can include a memory 432 and a processor 430 configured to determine failure of a UV sensor in accordance with the present disclosure. Further, controller 404 can include an adjustable voltage supply 434 and sense circuitry 436.

Adjustable voltage supply 434 can supply an excitation voltage to a UV sensor (e.g., UV sensor 106 and 306 described in connection with FIGS. 1 and 3, respectively). For example, adjustable voltage supply 434 can supply a range of excitation voltages to a UV sensor (e.g., 0 volts to 12 volts).

Sense circuitry 436 can be circuitry that can sense UV emission. For example, sense circuitry 436 can determine a UV event has occurred when a UV sensor is in the presence of UV emissions.

The memory 432 can be any type of storage medium that can be accessed by the processor 430 to perform various examples of the present disclosure. For example, the memory 432 can be a non-transitory computer readable medium having computer readable instructions (e.g., computer program instructions) stored thereon that are executable by the processor 430 to compare an excitation voltage at which a conduction event occurs to a reference voltage to determine whether a UV sensor has failed. That is, processor 430 can execute the executable instructions stored in memory 432 to compare an excitation voltage at which a conduction event occurs to a reference voltage to determine whether a UV sensor has failed.

The memory 432 can be volatile or nonvolatile memory. The memory 432 can also be removable (e.g., portable) memory, or non-removable (e.g., internal) memory. For example, the memory 432 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical storage, and/or a magnetic medium such as magnetic cassettes, tapes, or disks, among other types of memory.

Further, although memory 432 is illustrated as being located within controller 404, embodiments of the present disclosure are not so limited. For example, memory 432 can also be located internal to another computing resource (e.g., enabling computer readable instructions to be downloaded over the Internet or another wired or wireless connection).

As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processor. It is presumed that logic similarly executes instructions for purposes of the embodiments of the present disclosure.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A controller for a determining failure of an ultraviolet (UV) sensor, comprising:
   a memory; and
   a processor configured to execute executable instructions stored in the memory to:
   reduce, by the controller in response to a UV sensor failure check, an excitation voltage of a UV sensor from a first voltage level until no conduction occurs in the UV sensor, wherein the excitation voltage when no conduction occurs corresponds to a second voltage level;
   increase, from the second voltage level by the controller upon no conduction occurring in the UV sensor, the excitation voltage of the UV sensor until a conduction event occurs, wherein the excitation voltage at the conduction event corresponds to a third voltage level;
   compare, by the controller, the excitation voltage at the third voltage level at which the conduction event occurs to a reference voltage; and
   determine, by the controller, whether the UV sensor has failed based on the comparison.

2. The controller of claim 1, wherein the UV sensor is determined to have failed upon the excitation voltage at which the conduction event occurs and the reference voltage being different.

3. The controller of claim 1, wherein:
   the reference voltage is a reference voltage range; and
   wherein the UV sensor is determined to have failed upon the excitation voltage at which the conduction event occurs being outside the reference voltage range.

4. The controller of claim 1, wherein the processor is configured to execute the instructions while the UV sensor is detecting UV events.

5. The controller of claim 1, wherein the processor is configured to execute the instructions upon the excitation voltage at which the conduction event occurs being the same as the reference voltage.

6. The controller of claim 1, wherein the processor is configured to execute the instructions at a particular frequency per unit of time.

7. The controller of claim 1, wherein the processor is configured to conclude executing the instructions upon the UV sensor being determined to have failed.

8. The controller of claim 1, wherein the UV sensor is locked out upon determining the UV sensor has failed.

9. A system for determining failure of an ultraviolet (UV) sensor, comprising:
   a UV sensor, configured to detect one or more UV events; and
   a controller configured to:
   reduce an excitation voltage of the UV sensor in response to a UV sensor failure check from a first voltage level until no conduction occurs in the UV sensor, wherein the excitation voltage when no conduction occurs corresponds to a second voltage level;
   increase, from the second voltage level upon no conduction occurring in the UV sensor, the excitation voltage of the UV sensor until a conduction event occurs, wherein the excitation voltage at the conduction event corresponds to a third voltage level;
   compare the excitation voltage at the third voltage level at which the conduction event occurs to a reference voltage; and
   determine whether the UV sensor has failed based on the excitation voltage at which the conduction event occurs being higher or lower than the reference voltage.

10. The system of claim 9, wherein a UV event occurs when the UV sensor detects UV emissions.

11. The system of claim 9, wherein the reference voltage is an excitation voltage at which the UV sensor is expected to detect a conduction event.

12. The system of claim 9, wherein the conduction event is defined by a first instance of conduction in the UV sensor as the excitation voltage of the UV sensor is increased when the UV sensor is in the presence of UV emissions.

13. The system of claim 9, wherein the conduction event occurs within a known range of excitation voltages.

14. The system of claim 9, wherein the reference voltage is a range of excitation voltages.

15. The system of claim 14, wherein the UV sensor is determined to have failed upon the excitation voltage at which the conduction event occurs being outside the range of excitation voltages.

16. The system of claim 14, wherein the UV sensor is determined to not have failed upon the excitation voltage at which the conduction event occurs being within the range of excitation voltages.

17. A method for determining failure of an ultraviolet (UV) sensor, comprising:
   reducing, by a controller in response to a UV sensor failure check, an excitation voltage of a UV sensor from a first voltage level until no conduction occurs in the UV sensor, wherein the excitation voltage when no conduction occurs corresponds to a second voltage level;
   increasing, from the second voltage level by the controller upon no conduction occurring in the UV sensor, the excitation voltage of the UV sensor until a conduction event occurs, wherein the excitation voltage at the conduction event corresponds to a third voltage level;
   comparing, by the controller, the excitation voltage at the third voltage level at which the conduction event occurs to a reference voltage;
   determining, by the controller, whether the UV sensor has failed based on the excitation voltage at which the conduction event occurs being higher or lower than the reference voltage; and
   locking out, by the controller, the UV sensor based on the determination the UV sensor has failed.

18. The method of claim 17, wherein the method is repeated at a particular frequency per unit of time.

19. The method of claim 18, wherein the particular frequency per unit of time is more than once per second.

20. The method of claim 18, wherein the particular frequency per unit of time increases as the UV sensor ages.

* * * * *